US010438826B2

(12) United States Patent
Lary

(10) Patent No.: US 10,438,826 B2
(45) Date of Patent: *Oct. 8, 2019

(54) FLUID MONITORING SYSTEM AND METHOD FOR SEMICONDUCTOR FABRICATION TOOLS

(71) Applicant: WaferTech, LLC, Camas, WA (US)

(72) Inventor: Chris Lary, Camas, WA (US)

(73) Assignee: WAFERTECH, LLC, Camas, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/059,962

(22) Filed: Aug. 9, 2018

(65) Prior Publication Data

US 2018/0374728 A1 Dec. 27, 2018

Related U.S. Application Data

(63) Continuation of application No. 14/976,944, filed on Dec. 21, 2015, now Pat. No. 10,056,276.

(60) Provisional application No. 62/095,615, filed on Dec. 22, 2014.

(51) Int. Cl.
| | |
|---|---|
| *H01L 21/67* | (2006.01) |
| *C23C 16/00* | (2006.01) |
| *G01M 1/00* | (2006.01) |

(52) U.S. Cl.
CPC ........ *H01L 21/67253* (2013.01); *C23C 16/00* (2013.01); *G01M 1/00* (2013.01)

(58) Field of Classification Search
None
See application file for complete search history.

(56) References Cited

U.S. PATENT DOCUMENTS

| 6,152,818 | A | 11/2000 | Jacob |
| 8,887,549 | B2 | 11/2014 | Mendelson |
| 10,056,276 | B2* | 8/2018 | Lary ........................ C23C 16/00 |
| 2002/0083984 | A1 | 7/2002 | Easton |
| 2003/0212507 | A1 | 11/2003 | Wei |
| 2004/0035851 | A1 | 2/2004 | Antoniou |
| 2004/0168767 | A1 | 9/2004 | Kanno |
| 2005/0024216 | A1 | 2/2005 | Crooks |
| 2006/0190099 | A1* | 8/2006 | Nangoy ............... G05B 13/021 700/28 |

(Continued)

*Primary Examiner* — William B Perkey
(74) *Attorney, Agent, or Firm* — Duane Morris LLP

(57) ABSTRACT

A system and method provide for monitoring and controlling fluid flow in semiconductor manufacturing apparatuses. The method and system include a vortex flow meter coupled to a digital readout that displays the measured flow rate and trip point. The flow meter display includes input devices used to adjust the trip point. The system and method provide for sending signals via a custom relay to the semiconductor manufacturing apparatus which is adapted to terminate a processing operation or change the fluid flow if the trip point is tripped. The system and method also provide for sending an electrical signal to a computer by way of a data acquisition unit and a converter. The converter converts the signal to a communication protocol consistent with the computer network and provides fluid flow information and trip point data as a function of time to the computer which then displays such data graphically.

20 Claims, 2 Drawing Sheets

(56) References Cited

U.S. PATENT DOCUMENTS

| | | | |
|---|---|---|---|
| 2007/0204914 A1* | 9/2007 | Kurosawa | G05D 11/132 137/487.5 |
| 2008/0156105 A1* | 7/2008 | Ishikawa | G01F 1/3209 73/861.22 |
| 2010/0132813 A1 | 6/2010 | Mendelson | |
| 2016/0076909 A1 | 3/2016 | Klicpera | |
| 2016/0178416 A1 | 6/2016 | Lary | |
| 2016/0189993 A1 | 6/2016 | Nakagawa | |
| 2016/0211158 A1 | 7/2016 | Yeow | |
| 2018/0374728 A1* | 12/2018 | Lary | C23C 16/00 |

* cited by examiner

FLUID MONITORING SYSTEM AND METHOD FOR SEMICONDUCTOR FABRICATION TOOLS

RELATED APPLICATIONS

This application is a continuation of U.S. patent application Ser. No. 14/976,944, filed Dec. 21, 2015, which claims priority of U.S. provisional application Ser. No. 62/095,615, entitled "Fluid Monitoring System and Method for Semiconductor Fabrication Tools," filed Dec. 22, 2014, the contents of each are hereby incorporated by reference as if set forth in their entireties.

BACKGROUND

Various types of semiconductor fabrication processing apparatuses, i.e. tools, are used to perform various processing operations upon semiconductor substrates in the manufacture/fabrication of semiconductor devices. Regardless of the processing operation carried out in the semiconductor manufacturing tool, the processing chambers within which the processing operations take place, are maintained at a desired temperature in order to efficiently carry out the processing upon the substrates and also to avoid equipment problems associated with the system becoming too hot or cold.

In order to maintain the manufacturing tool at a desired temperature level, fluids such as water, various other coolants, and various other fluids with high thermal conductivities, are used to flow throughout the manufacturing tools in fluid circulation systems to maintain the processing chambers at desired temperatures. If the flow levels within the heating or cooling loops are too high or too low, the temperature of the processing chamber may become too hot or too cold. This results in misprocessing of the substrates. This also results in various mechanical failures such as the melting of components of a fabrication tool, when a flow rate of cooling fluid, for example, is too low. Flow monitoring systems are used in conjunction with such heating and cooling fluid circulation systems.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
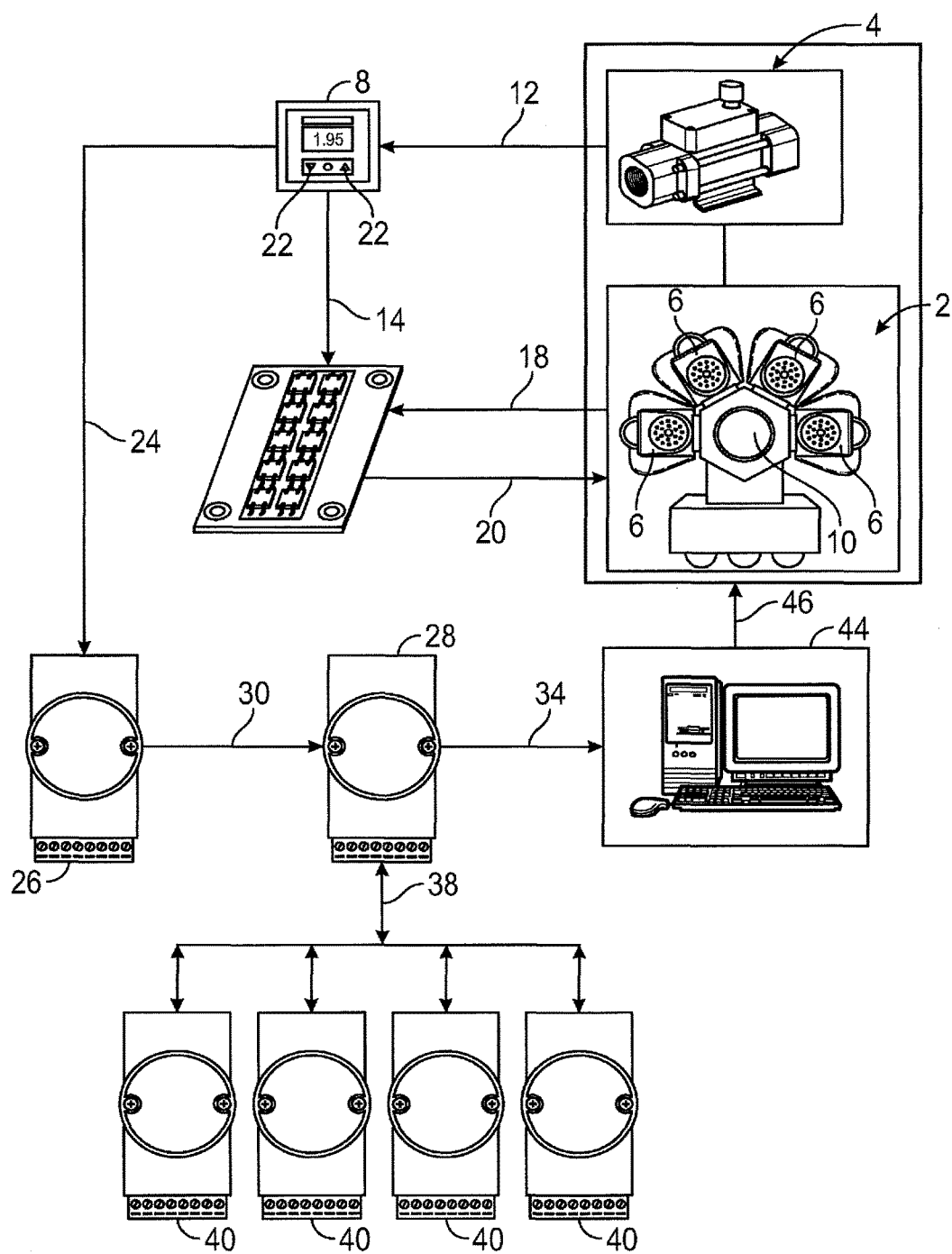
FIG. 1 is a schematic showing components of the fluid monitoring system according to various embodiments of the disclosure.

The present disclosure, in various embodiments, provides a system and method for monitoring fluid flow in a semiconductor manufacturing apparatus. In some embodiments, the fluid flow is a cooling or heating fluid directed to a chamber or to multiple chambers in a multiple chamber semiconductor manufacturing apparatus. The fluid is a liquid in some embodiments and is a gas in other embodiments. The fluid is used, in some embodiments, to maintain the chamber body at a desired temperature level and according to such embodiments, the fluid may circulate through pipes, tubes or other conduits that are conterminous with the surface of the chamber or chambers, or within the walls of the chamber or chambers themselves. In other embodiments, the fluid flow is in various pipes, tubes or other conduits and is directed to one or more internal components of a chamber such as an anode or a cathode or various other components that are desirably maintained within a particular temperature range. The disclosure relates to various types of semiconductor manufacturing apparatuses such as but not limited to chemical vapor deposition, CVD, manufacturing apparatuses, metal evaporation tools, sputtering apparatuses, other physical vapor deposition, PVD, tools, various etching apparatuses including reactive ion etching and ion milling apparatuses, photolithography tools, thermal processing apparatuses, atomic layer deposition, ALD, apparatuses, high density plasma, HDP, deposition tools, other deposition apparatuses, and various other semiconductor manufacturing tools The present disclosure, in various embodiments provides low flow resistance vortex style flow meters and a digital readout of the measured flow. Vortex flow meters include no moving parts and therefore do not trap air or use magnetic sensors that can improperly influence the flow reading.

A vortex flow meter provides a method of flow measurement that involves a bluff body (called a shredder bar) placed in the path of the flowing fluid in some embodiments. The bluff body placed in the path of the flowing fluid creates a low pressure zone behind the bluff body. in some embodiments. As the fluid passes this body, disturbances in the flow called vortices are created. The vortices trail behind the bluff body cylinder, alternatively from each side of the bluff body. This vortex trail is sometimes called the Von Kármán vortex street, after Von Kármán's 1912 mathematical description of the phenomenon. The frequency at which these vortices alternate size is essentially proportional to the flow rate of the fluid. Inside, atop, or downstream of the shredder bar is a sensor for measuring the frequency of the vortex shedding. In some embodiments, the sensor is a piezoelectric crystal, which produces a voltage pulse every time a vortex is created. Various other suitable sensors are used in other embodiments. The frequency of such a voltage pulse is proportional to the fluid velocity and a volumetric flow rate is calculated using the cross-sectional area of the flow meter. In some embodiments, the frequency is measured and the flow rate is calculated by the flow meter electronics using the equation f=SV/L, where f is the frequency of the vortices, L is the characteristic length of the bluff body, V is the velocity of the flow over the bluff body and S is the Strouhal number, which is essentially a constant for a given body shape within its operating limits. The aforementioned description describes some vortex flow meter embodiments, but other types of vortex flow meters with other sensors are used in other embodiments.

The vortex flow meter is coupled to an electronic flow rate display. The flow rate display provides a digital readout of the measured fluid flow and also a digital readout of the trip point for the flow meter. The vortex flow meter or the flow meter display includes an input member such as but not limited to a button, dial, thumbwheel, or other input device for changing the trip point setting. The adjusted trip point is then displayed digitally on the flow meter display.

The trip point is a set point that is "tripped" when the measured flow rate exceeds or falls below the trip point, depending on the embodiment. In some embodiments, the trip point represents a set value below which fluid flow is desired to be maintained. According to this embodiment, when the fluid flow exceeds the trip point, it trips the trip point. According to other embodiments, the trip point is a set point indicating a flow value above which the fluid flow is desired to be maintained. According to this embodiment, when the fluid flow falls below the trip point, the trip point is tripped.

The present disclosure, in various embodiments also provides for the flow meter and/or the flow meter display providing an electrical signal to the semiconductor manufacturing apparatus when the trip point is tripped. In some embodiments, the semiconductor manufacturing apparatus automatically turns off the processing chamber associated with the tripped trip point, when the trip point is "tripped."

The present disclosure, in various embodiments also provides for the flow meter and/or the flow meter display directing an electrical signal to a computer or other processor. The signal sent to the computer or other processor indicates the measured flow rate, the trip point value and whether or not the trip point value has been tripped. The computer or other processor provides for remote control of the flow meter. According to some embodiments, the computer or other processor can be used to change the trip point. The computer or other processor also displays the measured flow values and trip point as a function of time and may be positioned at a remote location. The computer or other processor also displays the measured flow values and trip points for multiple chambers of a semiconductor manufacturing apparatus. Trends over time for the various flow rates are thus provided. In some embodiments, the computer or other processor is also coupled to the semiconductor manufacturing apparatus itself and if a user notices that a trip point has been tripped, the user can utilize the computer or other processor to communicate directly with the semiconductor manufacturing apparatus and terminate the processing operation or otherwise adjust the semiconductor manufacturing apparatus.

Figure 2:
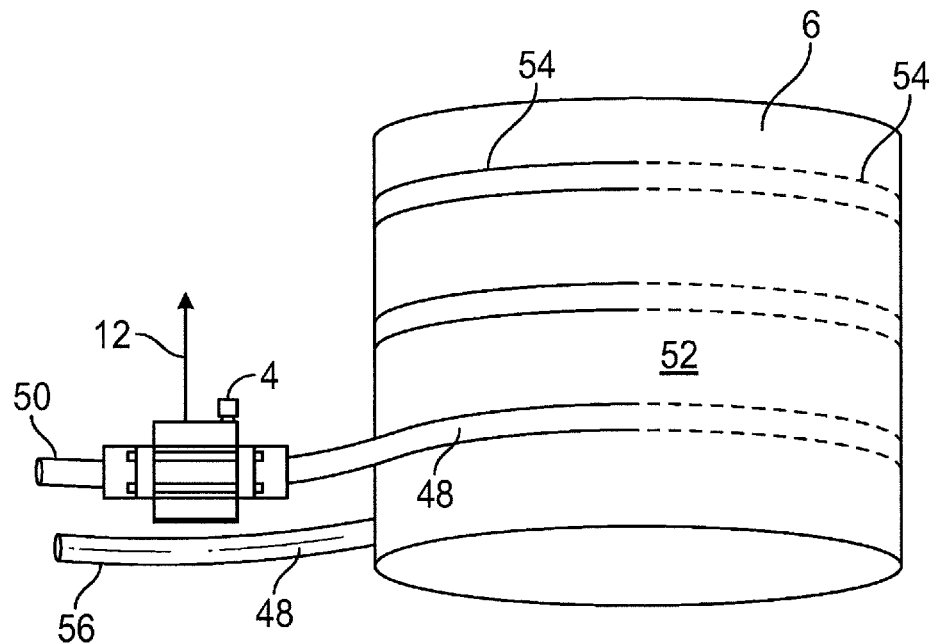
FIG. 2 shows a vortex flow meter and a fluid delivery system that delivers fluid to the processing chamber body according to various embodiments of the disclosure.
Figure 3:
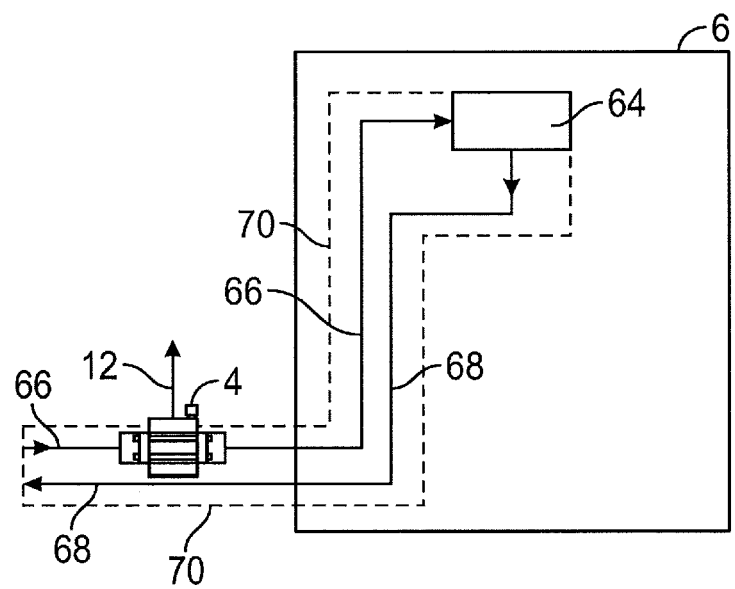
FIG. 3 shows a vortex flow meter and a fluid delivery system that delivers fluid to an internal component of a processing chamber according to various embodiments of the disclosure.

FIG. 1 is a schematic showing aspects of the method and system of the disclosure. Fab tool 2 is a semiconductor manufacturing apparatus within a semiconductor manufacturing facility. In some embodiments, fab tool 2 is a chemical vapor deposition, CVD, manufacturing apparatus. In other embodiments, fab tool 2 is a metal evaporation tool, sputtering apparatus, another physical vapor deposition, PVD, tool, various etching apparatuses including reactive ion etching and ion milling, photolithography tools, thermal processing apparatuses, atomic layer deposition, ALD, apparatuses, high density plasma, HDP, deposition tools other deposition apparatuses, and various other semiconductor manufacturing tools. In the illustrated embodiment, fab tool 2 includes four processing chambers 6 and also a transfer station 10. In other embodiments, other numbers of processing chambers are present. Coupled to one or all of processing chambers 6 is a fluid circulation system (such as shown in FIGS. 2 and 3) with at least one vortex flow meter 4. In some embodiments, a fluid circulation loop with at least one vortex flow meter is also coupled to transfer station 10.

Vortex flow meter 4 is as described above and is alternatively described as a low-resistance flow meter. Vortex flow meters manufactured by various companies, can be used. In one embodiment, the vortex flow meter is a model PF2W520T-N03-1 device manufactured by SMC Corporation of Japan, manufacturer of various pneumatic devices, but other vortex flow meters are used in other embodiments. Vortex flow meters 4 include no moving parts as described above. In some embodiments, vortex flow meter 4 also functions as a flow controller that controls the flow of cooling or other fluids delivered from the fluid source to processing chambers 6.

In some embodiments, each of processing chambers 6 includes at least one fluid flow circulation system in which fluid is delivered to the chamber and the fluid flow in the fluid circulation system is measured by an associated vortex flow meter 4. In some embodiments, processing chamber 6 includes a fluid flow circulation system with a heating or cooling fluid directed to the chamber body for maintaining a temperature of the chamber and also a fluid flow directed to one or more internal components of the processing chamber 6. In some embodiments, processing chamber 6 includes a fluid flow circulation system with a heating or cooling fluid directed to the chamber body for maintaining a temperature of the chamber and also to one or more internal components of the processing chamber 6.

Now referring to FIG. 2, according to one embodiment, processing chamber 6 has a chamber wall that includes outer surface 52. Processing chamber 6 may be a processing chamber for carrying out various semiconductor manufacturing operations in various semiconductor manufacturing apparatuses (fab tool 2 of FIG. 1) that contain one or multiple processing chambers 6. Fluid input line 50 is part of fluid circulation system 48 that delivers fluid to conduits 54, which contact outer surface 52 of processing chamber 6 or form part of the chamber wall that includes outer surface 52. Conduits 54 may be pipes, tubes or other conduits made of various suitable materials such as metal or other suitable materials, and in some embodiments, conduits 54 represent a groove or other passageway formed within the chamber walls of processing chamber 6, i.e. within outer surface 52, as indicated by the dashed line portions of conduit 54. In some embodiments, conduits 54 are ridges that extend along outer surface 52 but form a unitary piece with processing chamber 6 or with the outer chamber wall of processing chamber 6. Fluid output line 56 of fluid circulation system 48 contains the thermal control fluid, i.e., heating or cooling fluid after it has been used to heat or cool processing chamber 6. In various embodiments, the fluid delivered through fluid input line 50 is water or deionized water mixed with ethylene glycol, but other suitable heating or cooling fluids such as propylene glycol and any number of heat transfer fluid blends, may be used in other embodiments. Vortex flow meter 4 is coupled to and measures fluid flow in a fluid input line 50 in the illustrated embodiment. In other embodiments, vortex flow meter 4 is coupled to fluid output line 56. Vortex flow meter 4 delivers signal 12, which will be described in conjunction with FIG. 1.

FIG. 3 illustrates another embodiment in which cooling or heating fluid is delivered via fluid circulation system 70, to a component internal to processing chamber 6. In FIG. 3, processing chamber 6 includes internal component 64. In some embodiments, a processing chamber 6 includes heating or cooling fluid delivered both to the chamber body, such as shown in FIG. 2, and also to an internal component, such as internal component 64 of FIG. 3. Fluid circulation system 70 of FIG. 3 includes fluid input line 66 and fluid output line 68. In various embodiments, there may be one or two fluid circulation systems. In some embodiments, one fluid delivery line provides fluid both to the chamber body such as shown in FIG. 2, and also to an internal component such as internal component 64 shown in FIG. 3. In some embodiments, one fluid circulation system delivers fluid to the chamber body such as shown in FIG. 2, and another fluid circulation system delivers fluid to the internal component such as internal component 64 as shown in FIG. 3.

In some embodiments, internal component 64 is an anode, a cathode, a sputtering target chuck, or various other components such as a heater or susceptor, for which it is desired to maintain the component within a particular temperature range. Fluid input line 66 of fluid circulation system 70 delivers the cooling or heating fluid to internal component 64 and fluid output line 68 of fluid circulation system 70 delivers the output fluid. Vortex flow meter 4 is coupled to fluid input line 66 and is capable of measuring flow within fluid input line 66 in the embodiment illustrated in FIG. 3. In other embodiments, vortex flow meter 4 is coupled to fluid output line 68. Referring to FIGS. 2 and 3, vortex flow meter 4 may be disposed at any location along fluid input line 66 at which vortex flow meter 4 can measure the fluid flow rate of the cooling or heating fluid delivered to the processing chamber. In some embodiments, vortex flow meter is disposed to measure the fluid flow rate of the cooling or heating fluid at a location immediately before the cooling or heating fluid reaches the processing chamber 6. In other embodiments, vortex flow meter 4 may be disposed at any of various locations along fluid output line 68. Vortex flow meter 4 sends an electrical signal 12, as will be discussed in conjunction with FIG. 1.

Again referring to FIG. 1, vortex flow meter 4 provides electrical signal 12 to flow meter display 8. In some embodiments, flow meter display 8 is a unit manufactured by SMC Corp. of Japan and is a remote display. Flow meter display 8 digitally displays both the measured flow and trip point values in some embodiments. Flow meter display 8 provides clear digital readouts and, together with vortex flow meter 4, the readouts have a resolution accuracy of up to 0.05 gallons per minute. The trip point can be set to various accuracies including an accuracy of 0.05 gallons per minute. Input members 22 can be used to adjust the trip point values on the flow meter display 8. Input members 22 are buttons, knobs, dials, thumbwheels, or other input devices that can be used to adjust the trip point in various embodiments. Input members 22 are disposed on or coupled to flow meter display 8. In some embodiments such as shown in FIG. 1, flow meter display 8 displays a single value at any given time, i.e. the measured flow rate or the trip point. In other embodiments, flow meter display 8 displays both values simultaneously, i.e. flow meter display 8 includes two digital readouts. In some exemplary embodiments, flow meter display 8 displays a single value at any given time, but input members 22 can be used to toggle between the measured flow display and the trip point display.

Flow meter display 8 is directly coupled to vortex flow meter 4 and in various embodiments in which multiple vortex flow meters 4 are used in conjunction with multiple processing chambers 6, there are multiple flow meter displays 8, each associated with a vortex flow meter 4. In some embodiments, fab tool 2 includes multiple processing chambers 6 and each processing chamber 6 includes an associated vortex flow meter 4 and flow meter display 8. In some embodiments, the disclosure provides an enclosure custom fitted to the particular semiconductor manufacturing apparatus, the custom fitting including each of the flow meter displays 8 such that each of the flow meter displays is simultaneously viewable by an observer.

Flow meter display 8 sends electrical signal 14 to fab tool 2 and electrical signal 24 to computer 44 in the embodiment of FIG. 1. In some embodiments, the vortex flow meter 4 sends electrical signal 14 to fab tool 2 and electrical signal 24 to computer 44. In various embodiments, at least one of vortex flow meter 4 and flow meter display 8 delivers electrical signal 24 to computer 44 or another processor, and electrical signal 14 to fab tool 2. Electrical signal 24 includes information indicating if the measured fluid flow rate has tripped the trip point. In various embodiments, signal 24 further contains and delivers information regarding the measured fluid flow rate and the trip point to computer 44 or another processor. Computer 44 or another processor is configured to display the flow and the fluid flow trip point setting at a remote location.

Electrical signal 14 is delivered to fab tool 2 through processing board 16. Processing board 16 receives electrical signal 14 as an input signal from flow meter display 8 and in various embodiments, processing board 16 includes multiple relays and other electrical components that produce a different type of electrical signal from the input electrical signal 14. Flow meter display 8 delivers electrical signal 14 which may be in the form of an NPN signal, i.e. a signal through an NPN transistor, or a PNP signal, i.e. a signal through a PNP transistor, in various embodiments, but other types of signals are used in other embodiments. NPN and PNP bipolar transistors each advantageously produce appreciable current and are generated from a small semiconductor device. According to the embodiment in which electrical signal 14 is an NPN signal, a small current entering the base of an NPN transistor disposed within flow meter display 8 is amplified to produce a large emitter current delivered by flow meter display 8 as electrical signal 14. According to the embodiment in which electrical signal 14 is a PNP signal, a small current leaving the base of a PNP transistor disposed within flow meter display 8, is amplified in the collector output and delivered as electrical signal 14 by flow meter display 8. In some embodiments of the disclosure, the incoming signal that is amplified by the NPN or PNP transistor may be electrical signal 12 from vortex flow meter 4. NPN and PNP signals are advantageously used in some embodiments because they are solid state signals through an associated bipolar transistor which are small semiconductor devices, and enable a space savings with respect to a signal that passes through a relay and therefore requires additional space.

Processing board 16 provides a DC signal delivered along signal path 20, to fab tool 2 in various embodiments. Processing board 16 also receives input signal 18 which may be in the form of a DC signal, from fab tool 2. In some embodiments, the DC signals (input signal 18 and the DC signal along signal path 20) are 24 VDC signals but in other embodiments, other DC signals are used.

In some embodiments, processing board 16 receives an NPN signal from flow meter display 8 and converts it to a 24 VDC signal capable of interlocking fab tool 2. The electrical signal 14 output of flow meter display 8 is an NPN transistor output in some embodiments, where the signal is either an open signal or a ground (0V) signal, or a PNP output in other embodiments where the signal may be an open signal or a +VDC signal which may be up to +24V. Processing board 16 converts these signals to a DC signal delivered along signal path 20 to communicate with fab tool 2 in some embodiments. The VDC signal delivered along signal path 20 is a 24 VDC signal in some embodiments and in some embodiments, additional information is sent along signal path 20 that conveys information including the measured flow rate, the trip point and whether the flow rate has tripped the trip point. In some embodiments, there are multiple flow meter displays 8, each associated with a chamber 6 and therefore multiple input signals such as electrical signal 14, are delivered to processing board 16. According to this embodiment, multiple VDC signals are delivered along signal path 20 to each of the multiple processing chambers 6.

If the trip point is tripped, fab tool 2 can automatically terminate the operation in the affected chamber. In some embodiments, in which VDC signal sent along signal path 20, is a 24 VDC signal, a 24 VDC hardware interlock is included at fab tool 2, enabling fab tool 2 to terminate a processing operation if a signal with a voltage other than 24 volts, is received. Fab tool 2 is responsive to the conditions of processing board 16. Signal 18 indicates that the interlock signal for fab tool 2 goes from fab tool 2 through processing board 16 then back to fab tool 2 via a signal sent along signal path 20. If the trip point is tripped, the relay of processing board 16 will open, such that the 24 VDC signal fab tool 2 is lost, causing an interlocked condition. Fab tool 2 is pre-programmed by OEM (the Original Equipment Manufacturer) or other user to respond to this interlock condition and may terminate wafer processing or prevent further processing. In some embodiments, if the trip point is tripped, fab tool 2 can automatically adjust the flow rate in a fluid circulation line (such as fluid input line 50, conduits 54, fluid output line 56, fluid input line 66, fluid output line 68, shown in FIGS. 2 and 3) that it is in compliance with specification, i.e. such that it does not trip the trip point. In some embodiments, fab tool 2 sends a signal to a flow controller coupled to a fluid circulation line and in some embodiments in which vortex flow meter 4 is also a flow controller, fab tool 2 sends a signal to the flow controller of vortex flow meter 4 on fluid circulation line.

Flow meter display 8 also sends electrical signal 24 that eventually reaches computer 44 as shown in FIG. 1. In some embodiments, vortex flow meter 4 sends electrical signal 24 that eventually reaches computer 44 via data acquisition unit 26 and converter 28. Electrical signal 24 from vortex flow meter 4 or from flow meter display 8 is an analog signal. In some embodiments, data acquisition unit 26 produces signal 30 from analog electrical signal 24 using RS-485 communication protocol. In various embodiments, such as in FIG. 1, converter 28 converts the RS-485 signal 30 to RS-232 signal 34 which is delivered to computer 44. The RS-485 and RS-232 communication protocol is compatible with serial inputs for various computer networks, but other communication protocols are used in other embodiments. Data acquisition unit 26 and converter 28 enable multiple flow meter displays 8 to be daisy chained, i.e. connected in series to one another, and delivered to computer 44. In some embodiments, each of data acquisition unit 26 and converter 28 are ADAM (Advantech Corp.) brand devices. In some embodiments, data acquisition member 26 is an ADAM brand data acquisition unit, and converter 28 is an ADAM brand RS-232 to RS-485 converter and may be ADAM-4017 and ADAM-4520 models, respectively, in some embodiments. Other devices are used in other embodiments. Together, these units receive an analog voltage signal from flow meter display 8 and then communicate with computer 44 by sending RS-232 signal 34.

The preceding components of processing board 16, flow meter display 8, data acquisition unit 26 and converter 28, form a "master system" associated with the illustrated fab tool 2 and vortex flow meter 4. In the illustrated master system, converter 28 combines with data acquisition unit 26 to serve as a "master unit" which communicates with a network via computer 44.

Computer 44 represents various types of computers and other processors in various embodiments and may include or access various networks in various embodiments. Computer 44 receives RS-232 signal 34 for each vortex flow meter 4 and displays the measured flow rate and trip point and the comparison thereof over time. Long term flow rate trends are displayed graphically or in tabular or other formats in some embodiments. In some embodiments, computer 44 also communicates directly with fab tool 2 via signal 46. In some embodiments, a user can use computer 44 to terminate a processing operation or send other instructions to fab tool 2 using signal 46. In some embodiments, a user can use computer 44 to override an automatic response by fab tool 2, to terminate or continue a processing operation.

In addition to the master system described above, FIG. 1 also illustrates multiple slave units 40 such as may be present in various embodiments. Slave units 40 are slaves to the master system because slave units 40 do not include an associated converter 28. Each slave unit 40 is associated with another fab tool and another vortex flow meter 4, i.e. a fab tool and vortex flow meter other than the fab tool 2 and vortex flow meter 4 shown in FIG. 1. Each slave unit 40 represents a processing board, flow meter display and data acquisition unit associated with another fab tool, but the slave units 40 do not include a converter 28. The processing board, flow meter display and data acquisition unit associated with the slave units 40 may be the same as illustrated processing board 16, flow meter display 8 and data acquisition unit 26 in various embodiments.

Each slave unit 40 is dedicated to an associated fab tool that may be different than, or the same type of fab tool, as fab tool 2 of FIG. 1. Each slave unit 40 provides a signal which is delivered as signal 38 to converter 28 of the master system. Because each slave unit 40 is associated with the arrangement of components including data acquisition unit 26 as indicated above, each slave unit 40 delivers signals 38 which are similar to signals 30, each having been delivered from an associated data acquisition unit 26.

Illustrated converter 28 thus receives signal 30 and signals 38. Signal 30 is associated with fab tool 2 of the master system and signals 38 are associated with the other fab tools associated with slave units 40. Converter 28 then converts signal 30 and signals 38 to signals 34, as described above. Signals 34 are delivered to computer 44.

In various embodiments, all slave units 40 are connected to each other and the master system shown in FIG. 1 using RS485 communication protocol in a parallel network such as shown in the embodiment illustrated in FIG. 1. The master system is coupled to multiple slave units 40, as illustrated, such that computer 44 provides fluid loop monitoring and control to multiple fab tools.

In other embodiments with multiple fab tools, slave units 40 are not used and each fab tool 2 includes a master unit, i.e. includes both data acquisition unit 26 and converter 28.

In still other embodiments, there are no additional fab tools and no slave units 40.

According to some aspects, provided is a fluid loop monitoring and control system for a semiconductor manufacturing apparatus. The system comprises: a vortex flow meter coupled to a fluid circulation line that delivers a fluid to a chamber of the semiconductor manufacturing apparatus, the vortex flow meter configured to measure a fluid flow rate in the fluid circulation line; a flow meter display coupled to the vortex flow meter and including a digital readout of the measured fluid flow rate and a digital readout of a fluid flow trip point associated with the vortex flow meter; an input member disposed on or coupled to the flow meter display and configured to adjust the trip point, and at least one of the vortex flow meter and the flow meter display configured to deliver an electrical signal to a computer or other processor indicating if the measured fluid flow rate has tripped the trip point.

According to some aspects, provided is a fluid loop monitoring and control system for a semiconductor manufacturing apparatus. The system comprises a vortex flow meter coupled to a fluid circulation line that delivers a fluid to a processing chamber of the semiconductor manufacturing apparatus, the vortex flow meter configured to measure a fluid flow rate in the fluid circulation line. The system also includes a flow meter display coupled to the vortex flow meter and including a digital readout of the measured fluid flow rate and a digital readout of a fluid flow trip point associated with the vortex flow meter; an input member disposed on or coupled to the flow meter display and configured to adjust the fluid flow trip point, and at least one of the vortex flow meter and the flow meter display configured to deliver an electrical signal to a computer or other processor indicating if the measured fluid flow rate has tripped the trip point. At least one of the vortex flow meter and the flow meter display is configured to deliver a further electrical signal with the measured fluid flow rate and the trip point, to the computer or other processor, the computer or other processor configured to display the flow and the fluid flow trip point setting at a remote location. The fluid circulation line delivers fluid to a body of the chamber and also to internal components of the chamber.

According to another aspect, a method for monitoring and controlling a fluid flow in a semiconductor manufacturing apparatus, is provided. The method comprises: delivering a thermal control fluid via a fluid circulation system to a chamber of a semiconductor manufacturing apparatus; measuring fluid flow rate in the fluid circulation system using a vortex flow meter; displaying an indication of the measured fluid flow rate on a flow meter display, in digital format; displaying a flow trip point on the flow meter display in digital format; and sending an electrical signal to the semiconductor manufacturing apparatus indicating if the trip point is tripped. At least one of the vortex flow meter and the flow meter display delivers a further electrical signal to a computer or other processor, the further electrical signal including the measured fluid flow rate and the trip point; and the method. The method also provides for adjusting the fluid flow trip point using an input device associated with the flow meter display or the flow meter.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

The invention claimed is:

1. A fluid loop monitoring and control system for a semiconductor manufacturing apparatus, said system comprising:
    a vortex flow meter coupled to a fluid circulation line that is configured to deliver a fluid to a chamber of said semiconductor manufacturing apparatus, said vortex flow meter configured to measure a fluid flow rate in said fluid circulation line;
    a flow meter display coupled to said vortex flow meter configured to display a readout of said measured fluid flow rate; and
    an input member coupled to said flow meter display and configured to adjust a fluid flow trip point associated with said vortex flow meter.

2. The fluid loop monitoring and control system as in claim 1, wherein
    said at least one of said vortex flow meter and said flow meter display is further configured to deliver an electrical signal indicating said measured fluid flow rate and said fluid trip point, to a processor, and said processor is configured to display said measured fluid flow rate and said trip point setting at a remote location.

3. The fluid loop monitoring and control system as in claim 2, wherein said semiconductor manufacturing apparatus includes a plurality of said chambers and corresponding ones of said vortex flow meters, flow meter displays, fluid circulation lines, and input members, and wherein said processor is a computer configured to display corresponding ones of said measured fluid flow rates and said trip point settings associated with each of said plurality of said chambers, over time.

4. The fluid loop monitoring and control system as in claim 1, wherein said readout of said measured fluid flow rate and said readout of said fluid flow trip point are each digital readouts, said at least one of said vortex flow meter and said flow meter display is configured to further deliver a further electrical signal to said semiconductor manufacturing apparatus if said measured fluid flow trips said trip point, said further electrical signal being a signal from an NPN or a PNP transistor.

5. The fluid loop monitoring and control system as in claim 4, wherein said flow meter display is configured to deliver said further electrical signal to said semiconductor manufacturing apparatus and further comprising a relay member configured to have said further electrical signal pass therethrough, said relay member further configured to convert said further electrical signal from said flow meter display, to a +24 VDC signal.

6. The fluid monitoring and control system as in claim 4, wherein said semiconductor manufacturing apparatus is configured to automatically terminate a processing operation or adjust said fluid flow rate if said measured fluid flow rate trips said trip point.

7. The fluid loop monitoring and control system as in claim 1, further comprising at least one data acquisition unit and a converter and wherein said at least one data acquisition unit is configured to convert an analog electrical signal from said flow meter display to an RS-485 signal and wherein said converter is configured to convert said RS-485 signal to a RS-232 signal.

8. The fluid loop monitoring and control system as in claim 1, wherein said fluid circulation line is disposed on surfaces of components of said chamber and wherein said chamber is a processing chamber in which semiconductor device manufacturing operations are carried out.

9. The fluid loop monitoring and control system as in claim 1, wherein said fluid circulation line is configured to deliver said fluid to internal components of said chamber and wherein said chamber is a processing chamber in which semiconductor device manufacturing operations are carried out.

10. The fluid loop monitoring and control system as in claim 1, wherein said fluid circulation line is disposed in or on walls of said chamber and is also coupled to and configured to deliver said fluid, to internal components of said chamber.

11. The fluid loop monitoring and control system as in claim 1, wherein said semiconductor manufacturing apparatus includes a plurality of said chambers and corresponding ones of said vortex flow meters, flow meter displays and fluid circulation lines, said flow meter displays arranged in a single unit mounted on said tool such that said flow meter displays are simultaneously viewable.

12. A fluid loop monitoring and control system for a semiconductor manufacturing apparatus, said system comprising:
a vortex flow meter coupled to a fluid circulation line that is configured to deliver a fluid to a chamber of said semiconductor manufacturing apparatus, said vortex flow meter configured to measure a fluid flow rate in said fluid circulation line;
a flow meter display coupled to said vortex flow meter configured to display a readout of said measured fluid flow rate and a fluid flow trip point associated with said vortex flow meter; and
an input member coupled to said flow meter display and configured to adjust said fluid flow trip point,
wherein said semiconductor manufacturing apparatus is configured to automatically terminate a processing operation or adjust said fluid flow rate if said measured fluid flow rate trips said trip point.

13. The fluid loop monitoring and control system as in claim 12, wherein said semiconductor manufacturing apparatus includes a plurality of said chambers and corresponding ones of said vortex flow meters, flow meter displays, fluid circulation lines, and input members, and wherein said processor is a computer configured to display corresponding ones of said measured fluid flow rates and said trip point settings associated with each of said plurality of said chambers, over time.

14. The fluid loop monitoring and control system as in claim 12, wherein said readout of said measured fluid flow rate and said readout of said fluid flow trip point are each digital readouts, said at least one of said vortex flow meter and said flow meter display is configured to further deliver a further electrical signal to said semiconductor manufacturing apparatus if said measured fluid flow trips said trip point, said further electrical signal being a signal from an NPN or a PNP transistor.

15. The fluid loop monitoring and control system as in claim 14, wherein said at least one of said vortex flow meter and said flow meter display is further configured to provide said measured fluid flow rate and said fluid flow trip point to a processor for display at a remote location.

16. A method for monitoring and controlling a fluid flow in a semiconductor manufacturing apparatus, said method comprising:
delivering a thermal control fluid via a fluid circulation system to a chamber of a semiconductor manufacturing apparatus;
measuring fluid flow rate in said fluid circulation system using a vortex flow meter;
displaying an indication of said measured fluid flow rate on a flow meter display; and
displaying a flow trip point on said flow meter display.

17. The method of claim 16, further comprising:
sending an electrical signal to said semiconductor manufacturing apparatus indicating if said trip point is tripped;
delivering a further electrical signal to a processor, said further electrical signal including said measured fluid flow rate and said trip point; and
adjusting said fluid flow trip point using an input device associated with said flow meter display or said flow meter.

18. The method as in claim 17, further comprising said processor displaying said measured fluid flow rate and said trip point as a function of time and said processor sending signals to said semiconductor manufacturing apparatus that adjusts flow in said fluid circulation system or terminates a processing operation in said chamber.

19. The method as in claim 18, further comprising said semiconductor manufacturing apparatus automatically adjusting said fluid flow rate or terminating a processing operation in said chamber when said electrical signal indicates that said trip point has been tripped, and
wherein said processor sending signals overrides said manufacturing apparatus automatically adjusting said fluid flow rate or terminating a processing operation.

20. The method as in claim 16, further comprising said semiconductor manufacturing apparatus automatically adjusting said fluid flow rate or terminating a processing operation when said electrical signal indicates that said trip point has been tripped.

* * * * *